(12) United States Patent
Clark et al.

(10) Patent No.: US 6,535,397 B2
(45) Date of Patent: Mar. 18, 2003

(54) INTERCONNECT STRUCTURE FOR INTERCONNECTING ELECTRONIC MODULES

(75) Inventors: William Clark, Palm Bay, FL (US); Douglas Heckaman, Indialantic, FL (US); Edward Bajgrowicz, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 139 days.

(21) Appl. No.: 09/871,167

(22) Filed: May 31, 2001

(65) Prior Publication Data

US 2002/0180554 A1 Dec. 5, 2002

(51) Int. Cl.[7] .............................. H05K 7/04; H01P 1/04
(52) U.S. Cl. ..................... 361/788; 361/802; 361/805; 361/808; 361/809; 361/796; 439/61; 439/378; 439/579; 333/33; 333/260
(58) Field of Search ................................ 361/683–686, 361/778, 788, 796, 797, 801, 802, 805, 807–810; 439/61, 63, 378, 579, 581; 333/1, 33, 260

(56) References Cited

U.S. PATENT DOCUMENTS

| | | | |
|---|---|---|---|
| 4,641,140 A | | 2/1987 | Heckaman et al. ......... 342/371 |
| 4,695,810 A | | 9/1987 | Heckaman et al. ............ 333/1 |
| 4,994,771 A | * | 2/1991 | Takamine et al. ............. 333/33 |
| 5,130,893 A | * | 7/1992 | Straate et al. ................ 361/728 |
| 5,486,113 A | * | 1/1996 | Lundh .......................... 439/61 |
| 5,519,583 A | * | 5/1996 | Kolling et al. ............... 361/788 |
| 5,641,294 A | * | 6/1997 | Beard .......................... 439/247 |
| 5,761,052 A | * | 6/1998 | Wheeler-King et al. .... 361/803 |
| 5,896,473 A | * | 4/1999 | Kaspari ....................... 385/24 |
| 5,982,634 A | * | 11/1999 | Wronski ...................... 361/788 |
| 6,028,497 A | * | 2/2000 | Allen et al. .................. 333/246 |
| 6,098,131 A | * | 8/2000 | Unger et al. ................. 710/303 |
| 6,392,160 B1 | * | 5/2002 | Audry et al. ................. 174/261 |
| 6,394,815 B1 | * | 5/2002 | Sarno et al. .................. 439/61 |
| 6,407,652 B1 | * | 6/2002 | Kan ............................ 333/260 |

* cited by examiner

*Primary Examiner*—Albert W. Paladini
*Assistant Examiner*—John B Vigushin
(74) *Attorney, Agent, or Firm*—Allen, Dyer, Doppelt, Milbrath & Gilchrist, P.A.

(57) ABSTRACT

An interconnect structure interconnects electronic modules and includes a backplane assembly formed from a substantially rigid backplane plate that carries RF connectors and a digital motherboard having digital connectors for mating with digital connectors of electronic modules. A controlled impedance interconnect circuit is positioned on the rear surface of the backplane plate and interconnects the RF connectors carried by the backplane plate and digital connectors of the digital motherboard. A rack receives the backplane assembly and supports a plurality of electronic modules that are interconnected to each other via the backplane assembly.

31 Claims, 8 Drawing Sheets

INTERCONNECT STRUCTURE FOR INTERCONNECTING ELECTRONIC MODULES

FIELD OF THE INVENTION

This invention relates to the field of interconnect structures for interconnecting electronic modules, and more particularly, this invention relates to an interconnect structure for interconnecting electronic modules that reduces the required number of coaxial cables used to interconnect the electronic modules.

BACKGROUND OF THE INVENTION

Typical avionics applications used in high performance aircraft and similar end uses employ electronics modules that are blind-mated into racks. These modules require a large number of RF input/output connections for digital, analog and optical signals. Non-limiting examples include coaxial connectors for radio frequency connections, pigtail, splice or small form function optical connectors, and digital connectors, all known to those skilled in the art. As shown in FIG. 1, a module interface 20, such as part of a printed circuit board backplane, interfaces with various signals and power supplies using different connectors. These signals include analog, including RF signals, optical, low and high power RF, and power. Some module-to-module interconnects must operate at RF frequencies as high as 30 GHz. In some applications, the RF signals above 1 GHz are routed between modules within the same rack using coaxial cables, which has provided the necessary combination of high reliability, low loss, and controlled impedance at these frequencies. The coaxial cables are terminated with spring-loaded connectors that protrude through holes in a digital motherboard forming a backplane and then are attached to respective connectors. Behind the motherboard, the cables are routed in circuitous paths and supported to the motherboard by a variety of different securement mechanisms.

When many RF interconnects are used, the coaxial cables consume a large volume behind the motherboard, and as a result, their routing becomes complex and difficult. To fabricate a module assembly in this manner is difficult if a large number of coaxial cables are required. The available space may not permit proper routing between adjacent modules, and as a result, the cable connectors cannot be assembled onto the motherboard. Even if the cables are secured, they may not adequately float to allow proper mating to the module. Furthermore, the desired number of RF input/output (I/O) connectors on a single module may be large, such that the resulting spacing between I/O connectors cannot be accommodated with cable connectors.

Another drawback of these prior art backplane assemblies is their propensity to deflect under static loads caused by module insertion, and dynamic loads caused by vibration. Static deflections increase the chance of incomplete connector engagement, preventing proper operation. Static and dynamic deflections cause failure of the circuit traces within the printed circuit board, or failure of electrical components mounted on the surfaces. Dynamic deflections of a backplane wear a connector's internal contacts, eventually leading to failure of the connector. Dynamic deflections also cause phase noise induction on sensitive RF signals.

SUMMARY OF THE INVENTION

The present invention is advantageous and eliminates the large number of coaxial cables required for interconnecting various electronic modules. It incorporates a low-loss backplane assembly having a substantially rigid backplane plate that allows both digital and analog signals to be transmitted using various RF and digital connectors. It is also possible to use spaced optical connectors.

In accordance with one aspect of the present invention, the interconnect structure includes a backplane assembly that interconnects a plurality of electronic modules. This backplane assembly includes a substantially rigid backplane plate having a rear surface and a front surface that interfaces with electronic modules. A plurality of radio frequency (RF) connectors are carried by the backplane plate and extend from the front to the rear surface for receiving mating RF connectors of electronic modules.

A digital motherboard is formed as a printed circuit board and supported by the backplane plate. It includes digital connectors, as known to those skilled in the art, for mating with digital connectors of electronic modules. A controlled impedance interconnect circuit is positioned on the rear surface of the backplane plate and interconnects the RF connectors carried by the backplane plate and digital connectors of the digital motherboard. A rack receives the backplane assembly and supports a plurality of electronic modules that are interconnected to each other via the backplane assembly.

The controlled impedance interconnect circuit can include a plurality of waffleline grooves formed within the rear surface of the backplane plate. Waffleline wire can be received within the waffleline grooves and interconnect the RF connectors. These connectors can be formed as coaxial connectors having coaxial connector pins that extend to the rear surface on the backplane plate and are interconnected to each other by the controlled impedance interconnect circuit. The backplane plate can include formed cavities having holes that are dimensioned to receive the coaxial connectors.

In yet another aspect of the present invention, the controlled impedance interconnect surface can be formed from channel line or as a stripline circuit card carried by the rear surface of the backplane plate.

In still another aspect of the present invention, the rack and backplane plate are formed from a metallic material and are substantially similar as to their coefficient of expansion (CTE). A motherboard cavity receives the digital motherboard formed as printed circuit board and has openings extending to the front face through which the digital connectors extend for interfacing with digital connectors of electronic modules. Guide holes receive counterpart guide pins on an electronics module for aligning the electronics module with the backplane plate. The rack can include guide channels that receive guide members of an electronics module for aligning an electronics module with the backplane plate. The electronics module can act as a heat sink where the guide members of the electronics module in conjunction with the guide channel are operative for transfer of heat.

In yet another aspect of the present invention, a rear cover is formed of a metallic material that is substantially similar as to its coefficient of expansion with the backplane plate and supports the backplane plate thereto. The rear cover is secured to the rack and covers a portion of the rack and protects the rear surface of the backplane plate and any controlled impedance interconnect circuit positioned on the rear surface of the backplane plate. The rear cover can include formed cavities that cover any waffleline grooves with wires for connection to RF connectors. The cavities have peripheral walls that aid in isolating electrical signals routed through the waffleline grooves from other portions of the backplane plate.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 1:
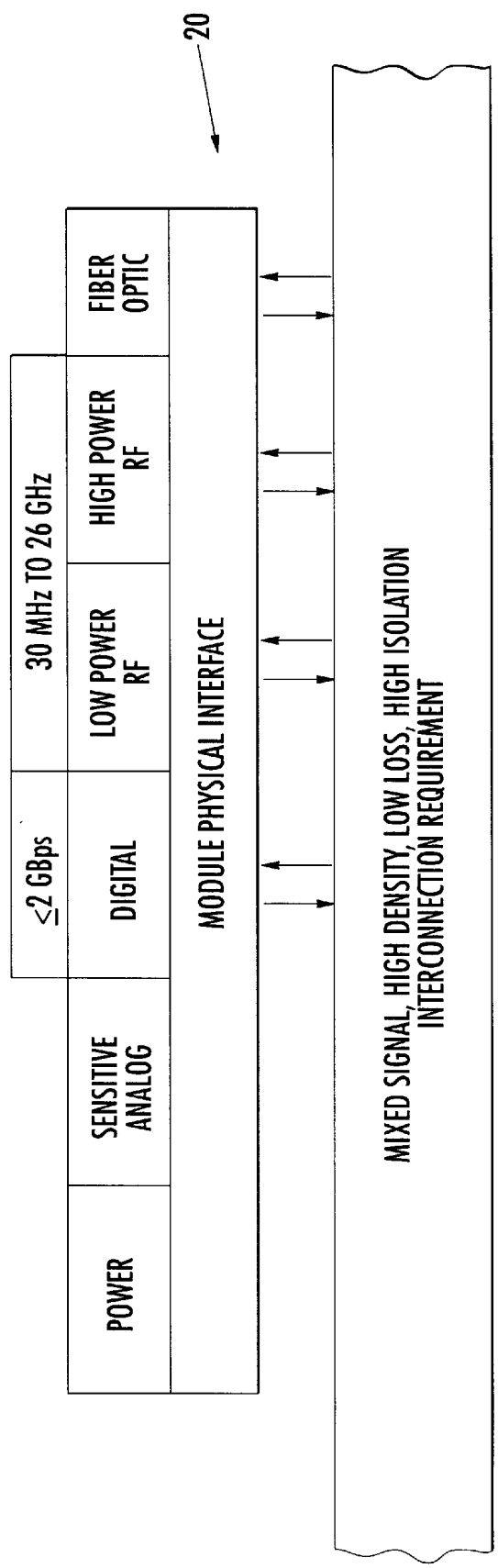
FIG. 1 is a block diagram that illustrates the various signals and control functions of an electronics module physical interface, which the present invention addresses.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous over prior art electronic module interconnect structures and similar module securement apparatus that used a combination of a multi-layer printed circuit board (motherboard), for conveying digital and analog signals, and discrete coaxial cables for conveying RF signals. In one aspect of the present invention, waffleline communications channels and related technology are used, such as disclosed in U.S. Pat. Nos. 4,641,140 and 4,695,810, assigned to the present assignee, the disclosures which are hereby incorporated by reference in their entirety. As set forth in the following description, several advantages over the conventional prior art apparatus and methods are achieved, including but not limited to:

a) A variety of electrical signal types including digital, RF/analog, and even optical can be accommodated;

b) Rapid and simple blind mate installation of a module into a rack eliminates the requirement of attaching cables to a module after the module is installed in the rack;

c) Signals that require low loss are readily routed with controlled impedance transmission lines, such as those required for high frequency RF and high speed digital signals, without the use of coaxial cable assemblies;

d) The volume behind the backplane that is dedicated to routing coaxial cables is reduced;

e) A high degree of interconnection density is permitted;

f) The assembly and testing of interconnects is reduced as compared to a conventional backplane using coaxial cables;

g) A rigid backplane structure resists deflections from static and dynamic loads, mitigating the wear of mating connectors and enhancing performance; and h) Module insertion loads that exceed those required to mate any connectors are not transferred into a motherboard, thereby preventing damage to the motherboard and any components mounted thereon.

The present invention uses high density RF I/O connectors on individual electronic modules, and high density RF interconnections between modules, thus reducing the space required behind a motherboard for cables and the cost of assembling and testing a backplane interconnect assembly. It accommodates different signal types within a single backplane assembly, and minimizes the deflection of the backplane, increasing performance and extending its useful life.

Referring now to FIGS. 2-11, basic elements of the interconnect structure in accordance with the present invention are illustrated. For purposes of explanation, the basic elements and components are first described, followed by a more detailed explanation of the components and their operative relation to each other.

Figure 3:
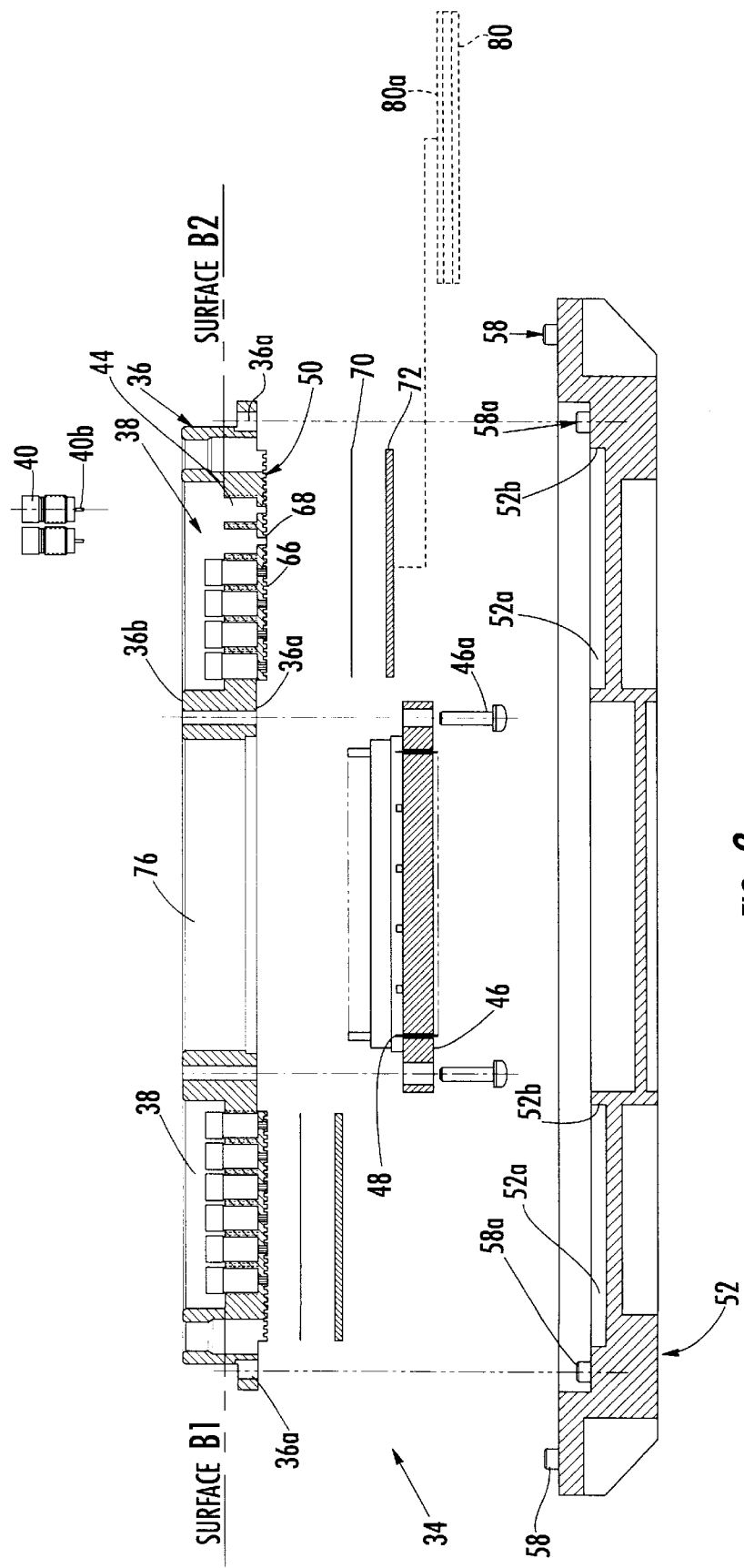
FIG. 3 is an exploded and fragmentary sectional view of the backplane assembly showing the backplane plate, digital motherboard, and rear cover.
Figure 4:
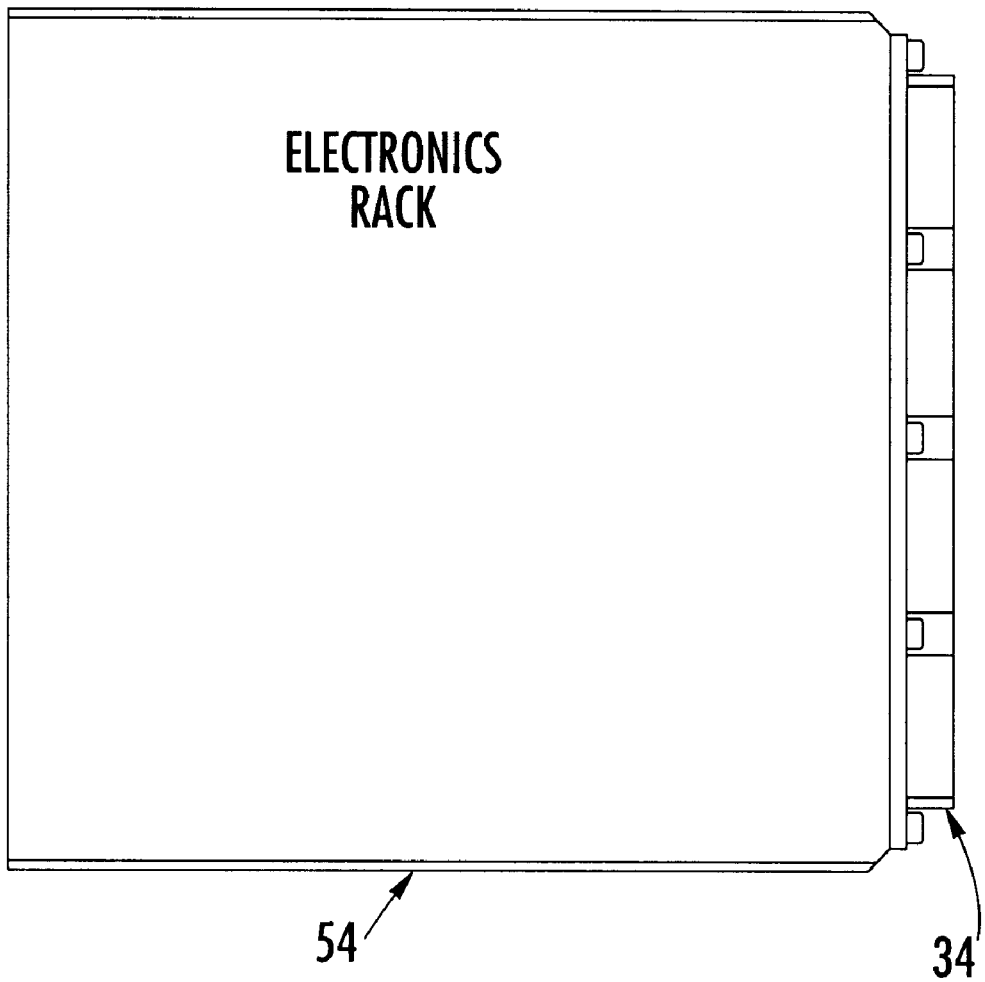
FIG. 4 is a side elevation view of the electronics rack that receives the backplane assembly.

The interconnect structure 30 interconnects various electronic modules 32 and includes a backplane assembly 34 as shown in the exploded fragmentary sectional view in FIG. 3. The electronics modules 32 include basic digital, RF/analog, power and other circuit components, typically used in avionics applications.

Figure 9:
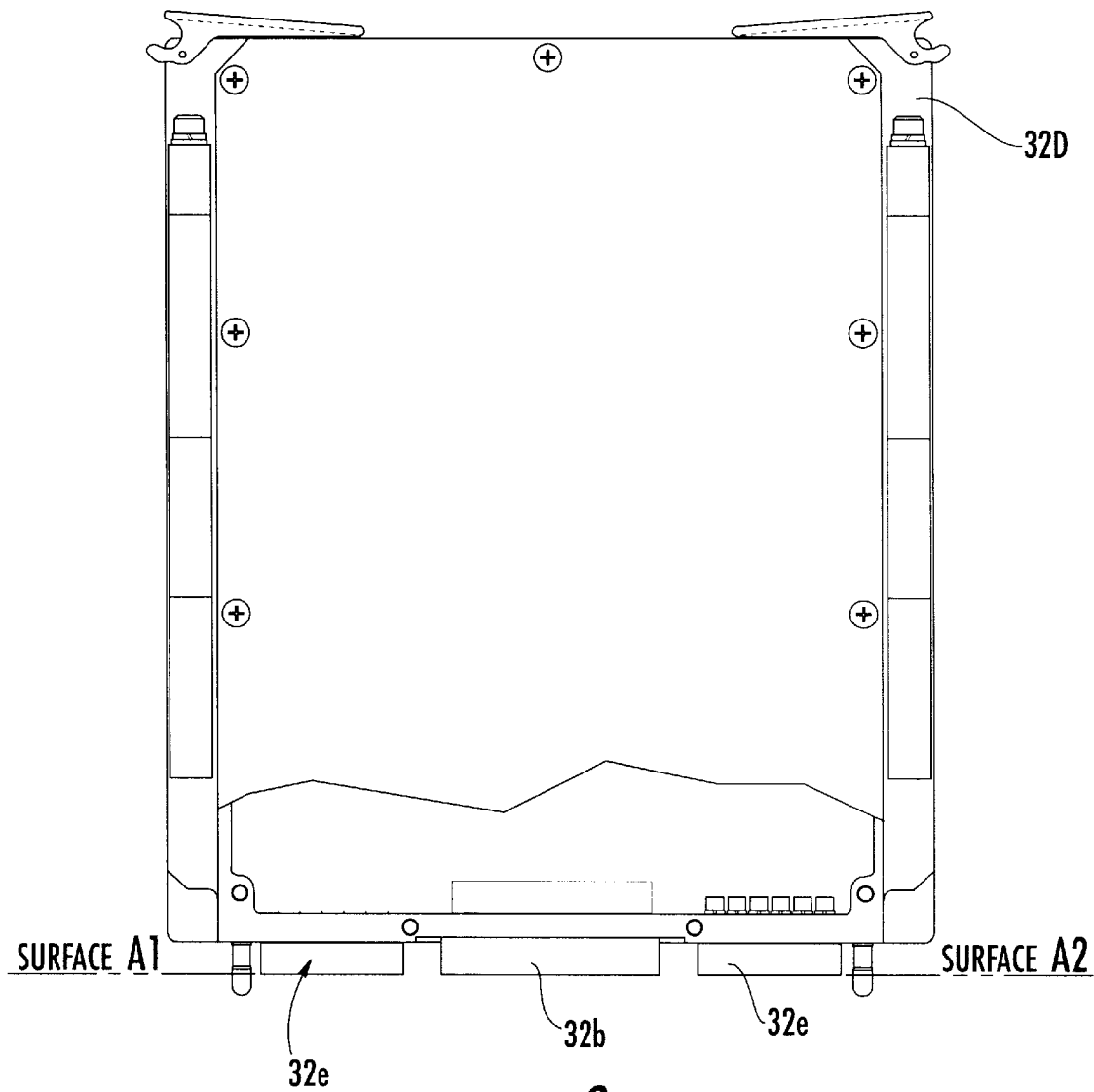
FIG. 9 is a plan view of an electronics module with the cover partially removed to show the RF, digital and optical connectors.
Figure 10:
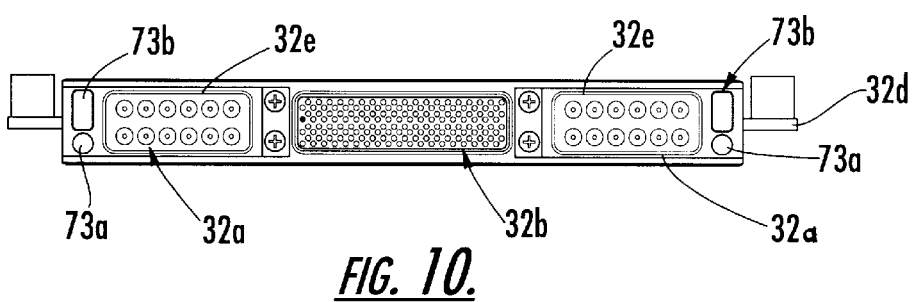
FIG. 10 is an end elevation view of the electronics module shown in FIG. 9 and showing the digital, RF and optical connectors.

A substantially rigid backplane plate 36 is formed of a metallic material, such as aluminum, and has a rear surface 36a and a front surface 36b that interfaces with electronic modules 32. Weight reduction pockets 36c are formed to reduce weight, facilitating conveyance and assembly. Each electronics module 32 is designed to act as a heat sink, as known to those skilled in the art. Radio frequency (RF) connectors 38 for carrying various RF/analog and other similar signals known to those skilled in the art and are preferably formed as coaxial connectors 40 carried by the backplane plate 36. The coaxial connectors 40 are typically threaded and contained within recessed cavities 42 having threaded holes 44 that are dimensioned to receive the coaxial connectors. The coaxial connectors 40 extend from the front to the rear surfaces 36a, 36b and receive corresponding mating RF connectors 32a of the electronic modules (FIGS. 9 and 10).

A digital motherboard 46 is formed as a printed circuit board and supported by the backplane plate 36. It includes digital connectors 48 of the type known to those skilled in the art, for mating with digital connectors 32b of the electronic modules 32. The digital motherboard 46 can also include various analog connectors and/or power connectors, as known to those skilled in the art, depending on the end use and design.

Figure 2:
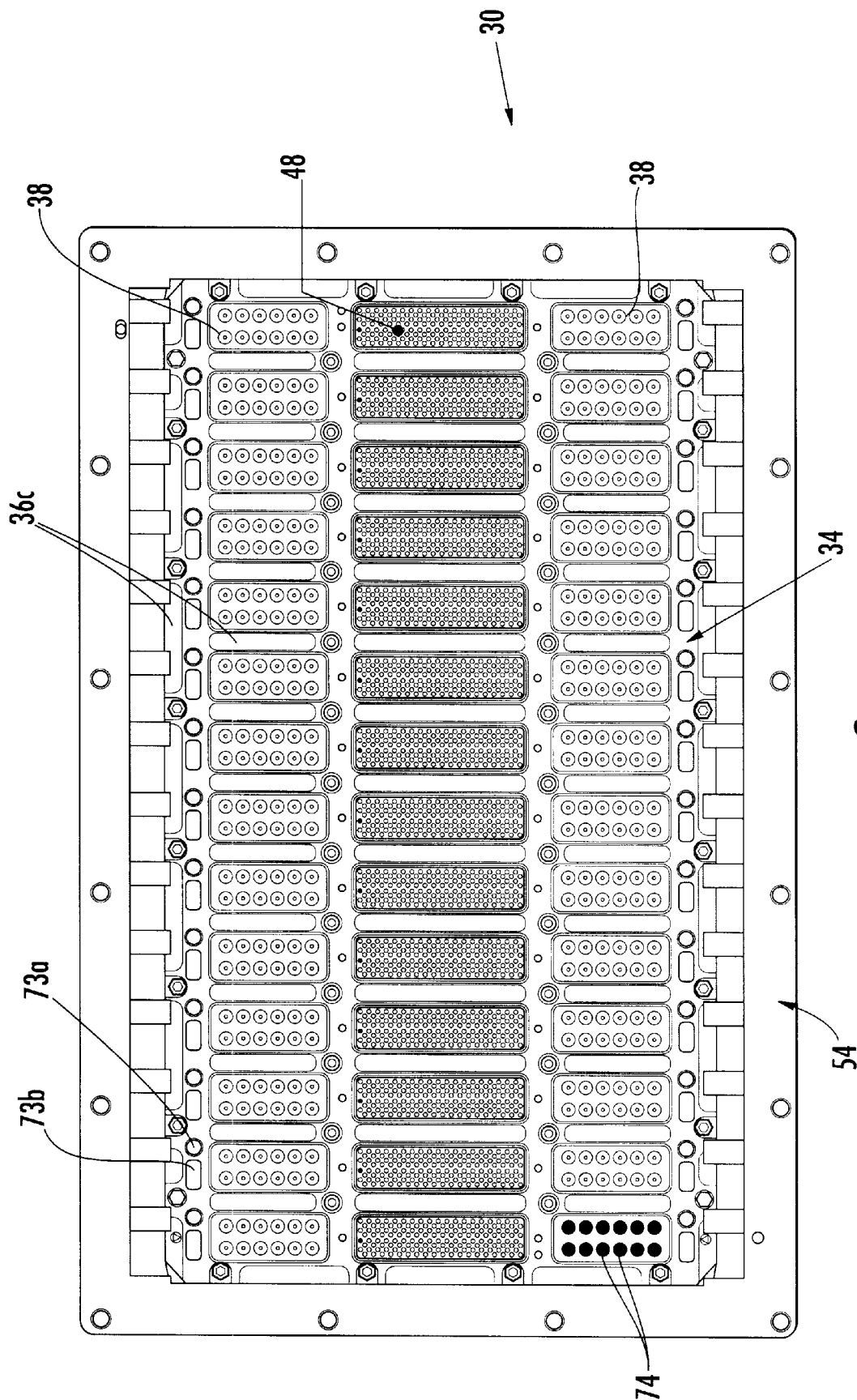
FIG. 2 is a plan view of an interconnect structure of the present invention showing the backplane assembly and electronics rack that receives the backplane assembly.
Figure 11:
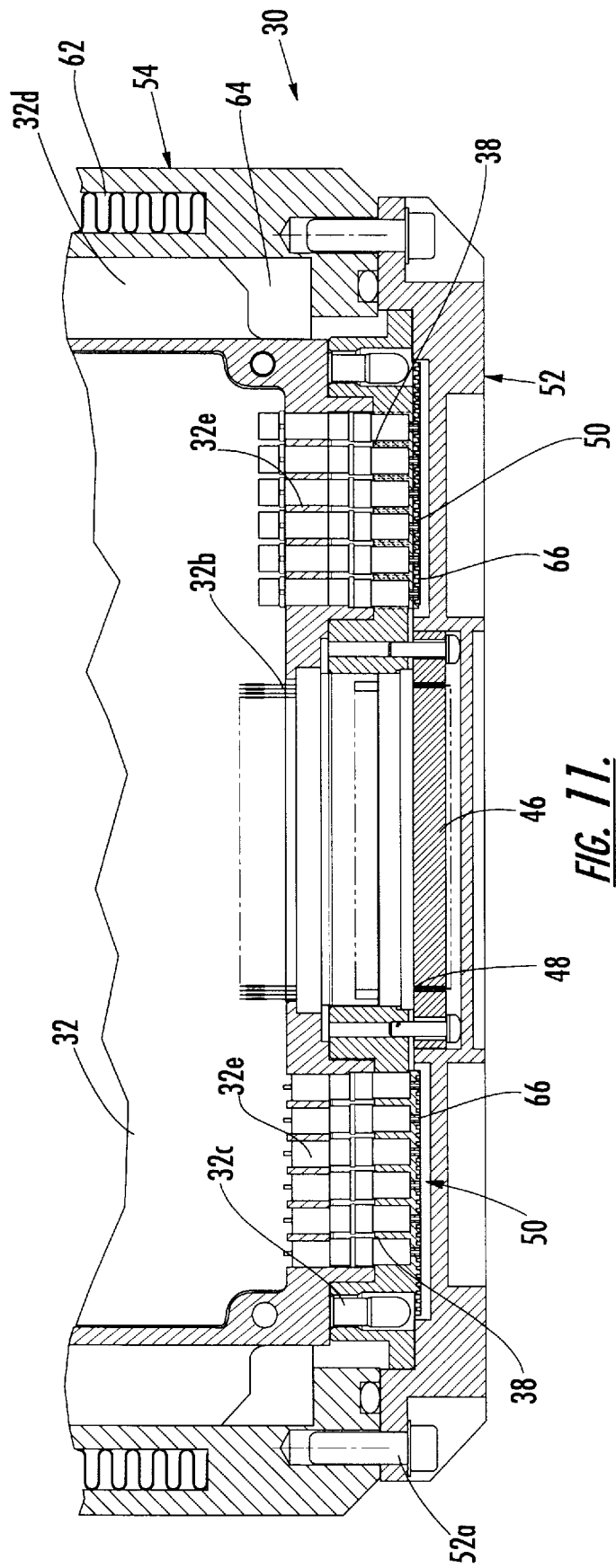
FIG. 11 is a partial cross-section of the rack having the backplane assembly and electronics module interconnected together.

As shown in FIG. 2 and best seen in FIG. 11, the coaxial and digital connectors are formed as blind mated connectors, as known to those skilled in the art. A controlled impedance interconnect circuit 50 is positioned on the rear surface 36a of the backplane plate 36 and interconnects the RF connectors 38 carried by the backplane plate. A rear cover 52 is formed of a metallic material that is substantially similar as to its coefficient of expansion with backplane plate and supports the backplane plate thereto.

An electronics rack 54 is formed of a metallic material, such as aluminum, which is substantially similar as to its coefficient of thermal expansion (CTE) with the backplane plate 36 and rear cover 52, and has the rear cover secured thereto, such as by bolts 52a or other attachment means (FIG. 11). It supports a plurality of electronic modules 32 that are interconnected to each other via the backplane assembly 34.

Figure 5:
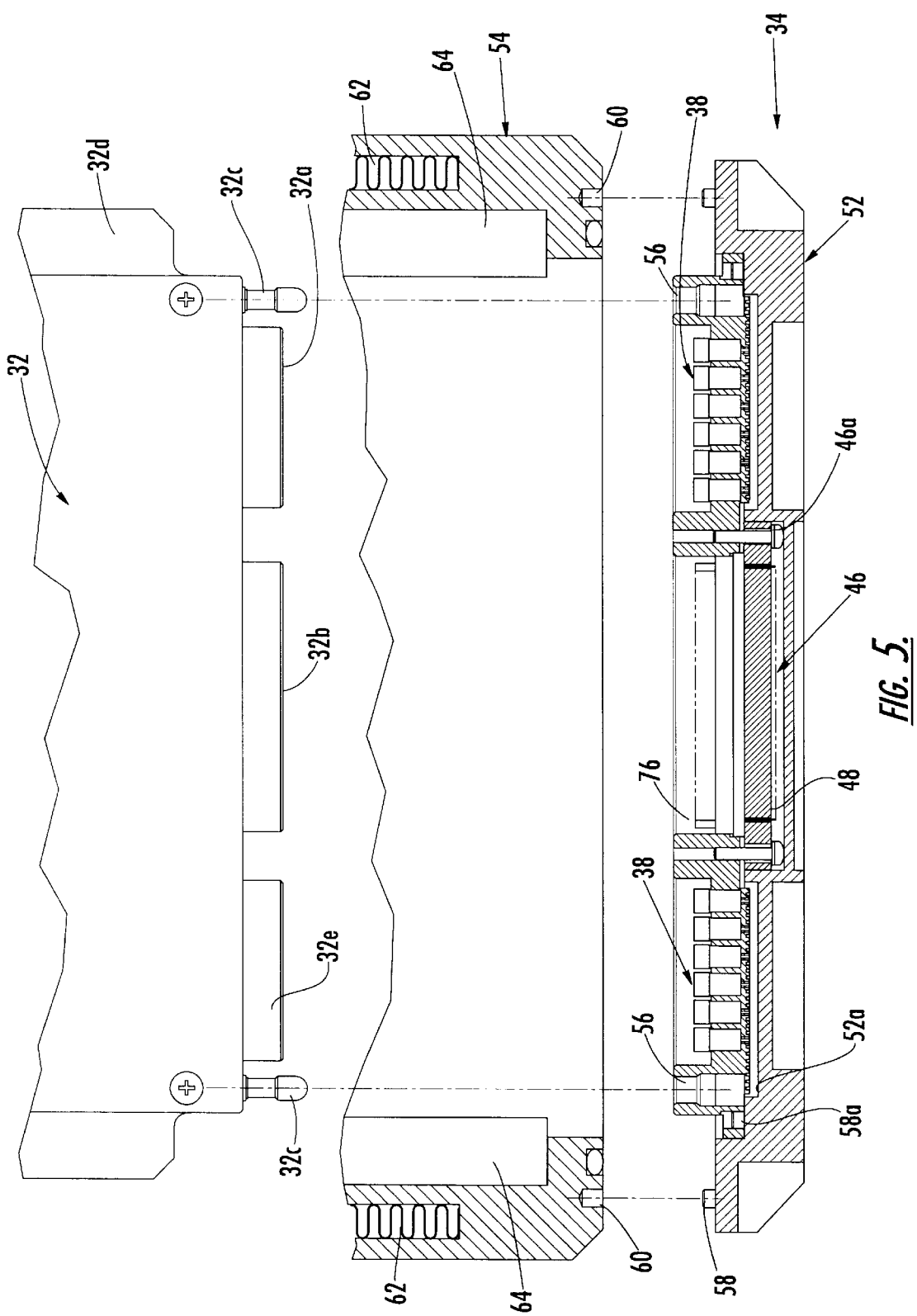
FIG. 5 is an exploded, partial cross-section view of the backplane assembly, electronics rack and an electronics module.
Figure 6:
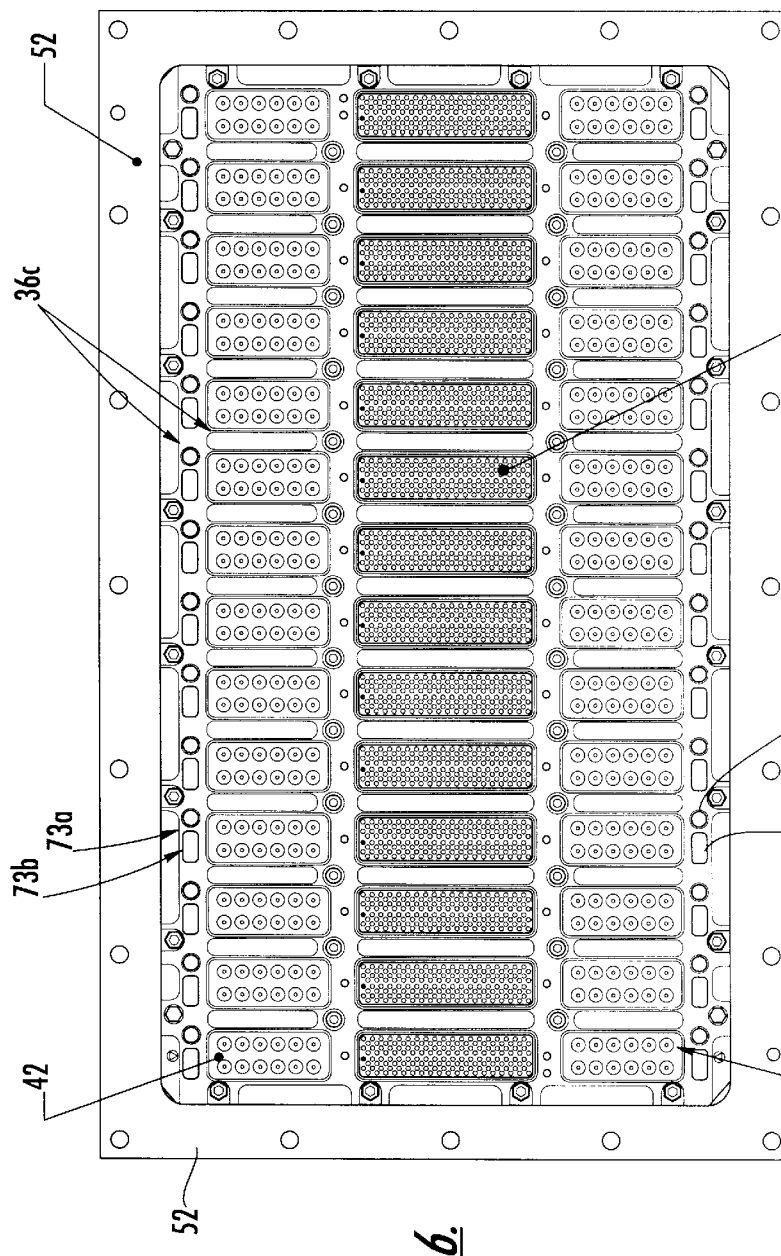
FIG. 6 is a plan view of the backplane assembly as removed from the electronics rack.
Figure 7:
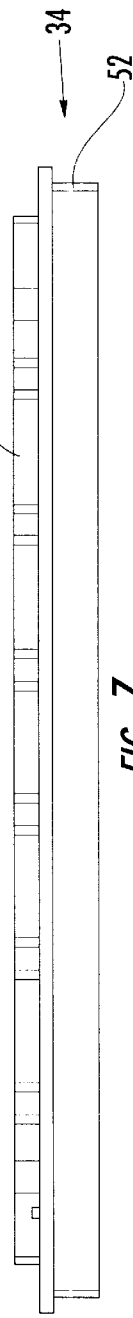
FIGS. 7 and 8 are respective front and side elevation views of the backplane assembly shown in FIG. 6.
Figure 8:
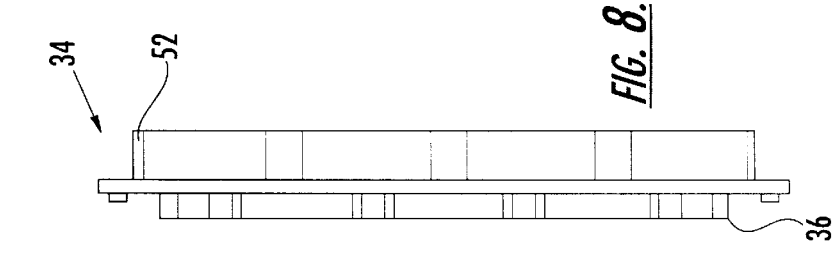

As shown in FIG. 5, the electronics module includes guide pins 32c that engage guide holes 56 formed in the backplane plate 36. The rear cover 52 includes guide pins 58 that are received in guide holes 60 of the electronics rack. A second pair of guide pins 58a on the rear cover are received in guide holes 36a on the backplane plate 36 to aid in alignment thereto. The electronics rack is typically formed from a thin stock metal, which is substantially similar in CTE to the backplane assembly. The rack is formed typically of aluminum. It may include air flow or liquid channels 62 to aid in heat transfer during operation.

Referring now to a first aspect of the present invention shown in FIGS. 5 and 11, the backplane assembly 34 and the electronics module 32, which acts as a heat sink, interface with each other at the front side 36b of the backplane plate. The backplane assembly 34 includes the printed circuit, digital motherboard 46 having digital connectors 48 attached thereto, the backplane plate 36, and rear cover 52 mounted to the rear surface 36a of the backplane plate 36.

The backplane plate 36 is formed from a metal material, such as aluminum, having waffleline grooves 66, as known to those skilled in the art, and formed as transmission links. These grooves are machined into portions of the rear surface 36a by any number of forming techniques, such as etching, sawing, machining, stamping or casting, known to those skilled in the art. Although waffleline grooves are used in this particular aspect of the present invention, it should be understood that other transmission links, such as channel line or stripline circuit cards, could be used. Waffeline is advantageous because it can be machined during the general machining steps that form the backplane plate. The waffeline allows intercoupling of high frequency, miniaturized integrated circuit components and provides a compact "universal" interconnection architecture and constant transmission line impedance along a transmission link, irrespective of IC component placement within a system architecture.

In the use of waffleline technology, the backplane plate is conductive and grooves are formed as a matrix or "grid work" of mutually orthogonal channels, creating a "waffle-iron"-like pattern in the rear surface of the conductive backplane plate. Usually the spacing between channels corresponds to the width of a channel, which in turn, can be sized to match the outer diameter of a wire 68 that is received in the channels. In some cases, the depth of a channel or groove is larger than the outer diameter of the wire to accommodate wire crossovers at intersections of channels.

Like channel line, the top surface of a "waffle-plate" is provided with a conductive foil 70 (or plate) to complete the shielding for the wires. A waffleline compressor plate 72 is received over the ground foil 70. In channel line, on the other hand, the grooves are patterned to map a specified interconnection highway among circuit element connection ports. The waffle structure has the same periodicity along either of the orthogonal directions of the channels, and thus, the characteristic impedance of the transmission link is a function by the size of the lands or mesas that are bounded by the channels in the widths of the channels. Usually, the period of the "waffle-line" structure is less than half the wavelength of signals to be conveyed.

It is possible to form the backplane plate 36 and waffleline grooves 66 by typically machining through parallel-spaced apart saw cuts or by milling. Pockets or cavities could also be provided for receiving different components and sized to accommodate high density leadless chip carriers with I/O port connections that are aligned with grooves or channels of the waffle structure, thereby facilitating interconnection through the channels of the waffle structure.

Further details of examples of the termination structure for the ends of various wire links, the enhanced configuration for the components, and the waffle iron structure, are set forth in detail in the incorporated by reference '140 and '810 patents.

Formed into the front surface 36b of the backplane plate 36 are those features that are convenient for interfacing with the electronics modules 32. For example, module guides 73a effect proper alignment of connectors on the electronic module with the RF and digital connectors on the backplane assembly. Keying guides 73b assure that an electronics module 32 is introduced into the proper location within the rack. The module guides 73a and keying guides 73b can be formed as respective guide pins and holes or other techniques known to those skilled in the art. The recessed cavities 42 that are formed into the front face of the backplane plate, and the threaded holes 44 positioned in the floor of the cavities secure the threaded, blind-mate coaxial connectors 40, such as a GPO (Gilbert push-on). These types of coaxial connectors 40 terminate with a small diameter pin 40b suitable for connecting to waffleline wire 68, or to channel line wire or to stripline features, as known to those skilled in the art.

Because the various connectors are recessed into the cavities in the backplane plate, they are protected from loose objects that fall into the rack during servicing. The center pin 40b on each coaxial connector 40 protrudes through the backplane plate 36 and is attached to the waffleline wire 68 that is received in the waffleline grooves 66. Another end of the waffleline wire 68 is attached to another coaxial connector pin, completing a low loss, controlled impedance module-to-module interconnect within the plane of the waffleline. Such interconnects are suitable for transmitting RF signals up to 30 GHz and high speed digital signals up to 40 Gbits/sec.

Although not illustrated in detail, the backplane plate could contain openings and features suitable for attaching fiber optic termini for connecting fiber optic cables, which pass through openings in the backplane plate and are routed between the plate and the rear cover to other fiber optic termini, forming an optical interconnection between modules. For purposes of example and illustration only, optical fiber interconnects are shown as darkened circles 74 in FIG. 2, to illustrate the possibility of having optical fiber interconnects.

As noted before, the backplane assembly 34 contains interconnects that convey analog and low speed digital signals between electronic modules. One type of interconnect includes the interconnect components on the printed circuit digital motherboard 46 with electrical, i.e., digital, connectors attached thereto. The "digital" connectors 48 are a type known to those skilled in the art. As shown in FIG.

3, the digital motherboard 46 is fastened to the rear surface of the backplane plate 36 by screws 46a or other means. Openings 76 (FIGS. 3, 5 and 11) in the backplane plate expose the front portions of the motherboard digital connectors on the front side of the plate. The motherboard digital connectors 48 are fully recessed within the backplane, protecting them from objects that fall into the rack during servicing. The digital motherboard may be fastened to the backplane plate structure at any convenient location by any means suggested by those skilled in the art.

The backplane plate 36 is fastened to the rear cover 52, which can be formed from a rigid metallic CTE matched material, such as aluminum. The rear cover 52 protects the rear surface of the motherboard, the waffleline interconnects, and the electronics rack. The rear cover 52 has one or more shallow cavities 52a formed in the areas covering the waffleline RF interconnection network, located on the backplane plate. The peripheral walls 52b of the cavities 52a isolate the electrical signals being routed within the waffleline area from the rest of the backplane. The floor of these cavities press the waffleline ground foil 70 via the elastomeric compressor plate 72 against the outboard surfaces of the waffleline grooves. This contributes to the controlled impedance characteristics of waffleline. The rear cover 52 includes the alignment pins 58 or similar formed structures to assist in aligning the backplane assembly to the electronics rack, and O-ring grooves (not shown in detail) to assist in sealing the electronics rack from the environment.

Because the backplane plate 36 is a rigid metal structure, it resists deflections created by static loads induced by module insertion, and dynamic loads, induced from vibrations in the field. The digital motherboard 46 is fastened to this rigid backplane plate at any convenient location, whereas with a conventional motherboard, attachment is limited to convenient locations along the rack walls. As illustrated, two rows of RF connectors are formed, and only one row of digital connectors. Any arrangement is possible. Thus, any deflections of the digital motherboard can be substantially reduced over standard techniques. By reducing static and dynamic deflections, connector performance is improved with high-speed digital and high frequency RF connections. Any failure caused by fretting corrosion or relative sliding of connector contact surfaces will also be reduced by the present invention.

The electronics module is formed as a heat sink from a rigid metal and CTE matched material having connector features formed as RF and digital connectors at its "connector end," to provide a convenient interface with the backplane assembly, as noted before. As illustrated in FIGS. 9 and 10, RF connectors 32a and digital connectors 32b are illustrated as part of the electronics module. A protective shroud 32e is formed to house the coaxial connectors. Each shroud 32e accurately locates and captures a plurality of coaxial connectors. Each shroud offers physical protection to the coaxial connectors when the module is not installed in the electronics rack. Respective protective shrouds could also be formed around digital connectors 40,38, but the cavity 42 acts as a protective device.

When the electronics module is mated with the backplane assembly, coplanar surfaces A1 and A2 (FIG. 9) on the shrouds 32e act as a mechanical stop for the electronics module. These surfaces come into intimate physical contact with coplanar surfaces B1 and B2 (FIG. 3) on the backplane plate. As a result, each shroud in the mated assembly condition forms an effective means for electrically isolating adjacent coaxial connectors. This is a significant advantage in systems requiring isolation between adjacent lines at high frequencies. The guide pins align the electronics module with the backplane assembly and keying features can insure that the electronics module is installed in the proper location within the electronics rack.

As noted before, the backplane plate and the module heat sink are formed such that when the electronics module is mated with the backplane assembly, coplanar surfaces A1 and A2 on the module stops against coplanar surfaces B1 and B2 of the backplane plate. This stop requires a small gap, typically less than about 0.01 inches between the mating surfaces of the digital connector.

This design ensures that strict control of the distance between the reference planes maintains performance at high frequencies and high digital speeds by proper engagement of mating coaxial connectors. It also prevents module insertion loads from being transferred into the printed circuit digital motherboard 46. Thus, the printed circuit digital motherboard and any electrical components attached thereto will not be overstressed. Conventional motherboard designs, which cannot prevent this excessive loading condition, must be relatively thick, or supporting structural members must be attached to the board to limit its deflection and reduce any resulting stresses. The latter may be difficult if the motherboard is highly congested with a multitude of coaxial cables, connectors, or other electrical components. This technique provides a reasonable EMI seal around the coaxial connectors creating effective isolation between adjacent coaxial connectors.

A second aspect of the present invention replaces the waffleline interconnect features with one or more multi-layer stripline, printed circuit boards that are suitably attached, by bonding, for example, to the backplane plate. An example of such card is shown in the dashed line card of FIG. 3, having planar card member 80 supporting stripline circuit 80a. This second configuration could advantageously provide higher levels of electrical isolation in areas where signal lines must cross. These crossovers may be routed on separate printed circuit layers, which may have an interposing ground layer.

Because the stripline printed circuit board may contain a multitude of layers, it permits many more signal "crossovers" to occur and allows freedom to route signals.

In yet another aspect of the present invention, channel line can be used as an interconnect structure. In this configuration, the repetitive grid pattern of waffleline grooves formed in the backplane plate is replaced with any number of individual channels machined into the same backplane plate. These channels are routed between any coaxial connectors to be interconnected. Unlike waffleline, these channels do not intersect periodically, but may intersect wherever transmission lines must cross. Unlike waffleline, each channel may be tailored in width and depth to accept insulated wires of various diameters. In this configuration, an insulated wire would be received in a channel and its ends suitably attached to the center conductor pin of the coaxial connectors to be interconnected. A ground foil is placed over the open surface of the channel to form a controlled impedance transmission line between connectors. This third design permits larger diameter wire to be used between the coaxial connectors on the backplane plate, thereby reducing the loss of the transmission line and permitting signals of higher power to be transmitted. Because the channels do not break out into other channels (except where a crossover is required) the electrical isolation between adjacent transmission lines is greater.

It is also possible to include variations of either of the embodiments noted alone or in combination of both.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. An interconnect structure for interconnecting electronic modules that each include RF connectors and digital connectors comprising:
    a backplane assembly for interconnecting a plurality of electronic modules and further comprising:
        a substantially rigid backplane plate having a rear surface and a front surface that interfaces with electronics modules;
        a plurality of radio frequency (RF) connectors carried by said backplane plate for interconnecting RF connectors of electronic modules;
        a digital motherboard supported by said backplane plate and including digital connectors for interconnecting digital connectors of electronic modules;
        a controlled impedance interconnect circuit positioned on the rear surface of the backplane plate for interconnecting RF connectors carried by said backplane plate and digital connectors of said digital printed circuit board; and
    a rack that receives said backplane assembly and supports a plurality of electronic modules that are interconnected to each other via the backplane assembly.

2. An interconnect structure according to claim 1, wherein said controlled impedance interconnect circuit comprises a plurality of waffleline grooves formed within the rear surface of said backplane plate, and waffleline wire contained within said waffleline grooves that interconnect RF connectors.

3. An interconnect structure according to claim 1, wherein said RF connectors are formed as coaxial connectors having coaxial connector pins that extend to the rear surface on said backplane plate and interconnected to each other by said controlled impedance interconnect circuit.

4. An interconnect structure according to claim 3, said backplane plate having holes that are dimensioned to receive said coaxial connectors.

5. An interconnect structure according to claim 1, wherein said controlled impedance interconnect circuit comprises channel line formed on said rear surface of said backplane plate.

6. An interconnect structure according to claim 1, wherein said controlled impedance interconnect circuit comprises a stripline circuit card carried by said rear surface of said backplane plate.

7. An interconnect structure according to claim 1, wherein said rack and backplane plate are formed from a metallic material and are substantially similar as to their coefficient of expansion (CTE).

8. An interconnect structure according to claim 1, wherein said backplane plate includes a motherboard cavity for receiving said digital motherboard, said cavity having openings extending to the front face through which the digital connectors extend for interfacing with digital connectors of electronics modules.

9. An interconnect structure according to claim 1, wherein said backplane plate includes guide holes for receiving counterpart guide pins on an electronics module for aligning an electronics module with the backplane plate.

10. An interconnect structure according to claim 1, wherein said rack includes guide channels for receiving guide members of an electronics module to enhance alignment and interconnection of an electronics module with the backplane plate.

11. An interconnect structure according to claim 1, and further comprising optical connectors supported by said backplane plate for connecting optical fiber to electronic modules.

12. An interconnect structure for interconnecting electronic modules that each include RF connectors and digital connectors comprising:
    a backplane assembly for interconnecting a plurality of electronic modules and further comprising:
        a substantially rigid backplane plate formed of a metallic material and having a rear surface and a front surface that interfaces with electronics modules;
        a plurality of radio frequency (RF) connectors carried by said backplane plate and extending from the front to the rear surface for interconnecting RF connectors of electronic modules;
        a digital motherboard supported by said backplane plate and including digital connectors for interconnecting digital connectors of electronic modules;
        a controlled impedance interconnect circuit positioned on the rear surface of the backplane plate for interconnecting RF connectors carried by said backplane plate and digital connectors of said digital motherboard;
        a rear cover formed of a metallic material that is matched as to its coefficient of expansion (CTE) with said backplane plate and supporting said backplane plate thereto; and
    a rack formed of a metallic material that is CTE matched with said backplane plate and rear cover, and having said rear cover secured thereto and supporting a plurality of electronic modules that are interconnected to each other via the backplane assembly.

13. An interconnect structure according to claim 12, wherein said controlled impedance interconnect circuit comprises a plurality of waffleline grooves formed within the rear surface of said backplane plate, and waffleline wire contained within said waffleline grooves that interconnect RF connectors.

14. An interconnect structure according to claim 13, wherein said rear cover includes formed cavities that cover said waffleline grooves, said cavities having peripheral walls that aid in isolating electrical signals from other portions of said backplane plate.

15. An interconnect structure according to claim 12, wherein said RF connectors are formed as coaxial connectors having a coaxial connector pins that extend to the rear surface on said backplane plate and interconnected to each other by said controlled impedance interconnect circuit.

16. An interconnect structure according to claim 15, said backplane plate having holes that are dimensioned to receive said coaxial connectors.

17. An interconnect structure according to claim 12, wherein said controlled impedance interconnect circuit comprises channel line formed on said rear surface of said backplane plate.

18. An interconnect structure according to claim 12, wherein said controlled impedance interconnect circuit comprises a stripline circuit card carried by said rear surface of said backplane plate.

19. An interconnect structure according to claim 12, wherein said backplane plate includes a motherboard cavity for receiving said digital motherboard, said cavity having openings extending to the front face through which the digital connectors extend for interfacing with digital connectors of electronics modules.

20. An interconnect structure according to claim 12, wherein said backplane plate includes guide holes for receiving counterpart guide pins on an electronics module for aligning an electronics module with the backplane plate.

21. An interconnect structure according to claim 12, wherein said rack includes guide channels for receiving guide members of an electronics module.

22. An interconnect structure according to claim 12, and further comprising optical connectors supported by said backplane plate for connecting optical fiber to electronic modules.

23. A backplane assembly for interconnecting a plurality of electronic modules that each include RF connectors and digital connectors comprising:
   a substantially rigid backplane plate having a rear surface and a front surface that interfaces with electronics modules;
   a plurality of radio frequency (RF) connectors carried by said backplane plate for interconnecting RF connectors of electronic modules;
   a digital printed circuit board supported by said backplane plate and including digital connectors for interconnecting digital connectors of electronic modules; and
   a controlled impedance interconnect circuit positioned on the rear surface of the backplane plate for interconnecting RF connectors carried by said backplane plate and digital connectors of said digital printed circuit board.

24. A backplane assembly according to claim 23, wherein said controlled impedance interconnect circuit comprises a plurality of waffleline grooves formed within the rear surface of said backplane plate, and waffleline wire contained within said waffleline grooves that interconnect RF connectors.

25. A backplane assembly according to claim 23, wherein said RF connectors are formed as coaxial connectors having a coaxial connector pins that extend to the rear surface on said backplane plate and interconnected to each other by said controlled impedance interconnect circuit.

26. A backplane assembly according to claim 23, said backplane plate having holes that are dimensioned to receive said coaxial connectors.

27. A backplane assembly according to claim 23, wherein said controlled impedance interconnect circuit comprises channel line formed on said rear surface of said backplane plate.

28. A backplane assembly according to claim 23, wherein said controlled impedance interconnect circuit comprises a stripline circuit card carried by said rear surface of said backplane plate.

29. A backplane assembly according to claim 23, wherein said backplane plate includes a motherboard cavity for receiving said digital printed circuit board, said cavity having openings extending to the front face through which the digital connectors extend for interfacing with digital connectors of electronics modules.

30. A backplane assembly according to claim 23, wherein said backplane plate comprises guide holes for receiving counterpart guide pins on an electronics module for aligning the electronics module with the backplane plate.

31. An interconnect structure according to claim 23, and further comprising optical connectors supported by said backplane plate for connecting optical fiber to said electronics modules.

\* \* \* \* \*

UNITED STATES PATENT AND TRADEMARK OFFICE
CERTIFICATE OF CORRECTION

PATENT NO. : 6,535,397 B2 Page 1 of 1
DATED : March 18, 2003
INVENTOR(S) : Clark et al.

It is certified that error appears in the above-identified patent and that said Letters Patent is hereby corrected as shown below:

<u>Title page,</u>
Item [56], U.S. PATENT DOCUMENTS, delete "Audry et al." insert -- Andry et al. --
Item [57], ABSTRACT,
Lines 8 and 9, delete "and digital connectors of said digital motherboard"

<u>Column 9,</u>
Line 39, delete "and interconnected" insert -- and are interconnected --

<u>Column 10,</u>
Lines 26-27, delete "and digital connectors of said digital motherboard"
Line 50, delete "a"

<u>Column 11,</u>
Lines 27-28, delete "and digital connectors of said digital printed circuit board"

<u>Column 12,</u>
Line 3, delete "a"
Line 4, delete "and interconnected" insert -- and are interconnected --
Line 19, delete "motherboard" insert -- printed circuit board --

Signed and Sealed this

Twelfth Day of August, 2003

JAMES E. ROGAN
*Director of the United States Patent and Trademark Office*